(12) United States Patent
Ueno (10) Patent No.: US 6,538,205 B2
(45) Date of Patent: *Mar. 25, 2003

(54) CABLE AND METHOD OF MANUFACTURING IT

(75) Inventor: Seiichi Ueno, Mie (JP)

(73) Assignee: The Furukawa Electric Co., Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/367,935

(22) PCT Filed: Dec. 4, 1998

(86) PCT No.: PCT/JP98/05489

§ 371 (c)(1),
(2), (4) Date: Aug. 24, 1999

(87) PCT Pub. No.: WO99/34373

PCT Pub. Date: Aug. 7, 1999

(65) Prior Publication Data

US 2002/0060087 A1 May 23, 2002

(30) Foreign Application Priority Data

Dec. 26, 1997 (JP) ............................................. 9-359240

(51) Int. Cl.⁷ ................................................. H01B 7/00
(52) U.S. Cl. ............................. 174/117 F; 174/117 FF
(58) Field of Search ........................ 174/117 F, 117 FF, 174/117 M, 117 A, 113 R (56) References Cited

U.S. PATENT DOCUMENTS 4,065,199 A * 12/1977 Andre et al. ............... 339/17 F
5,592,739 A * 1/1997 Ferrill et al. .............. 156/273.9
5,934,698 A * 8/1999 Izui et al. ................ 174/113 R

FOREIGN PATENT DOCUMENTS

| GB | 1 260 267 A | | 1/1972 | |
|----|----|----|----|----|
| JP | 42-19305 | | 11/1967 | |
| JP | 48-63266 | * | 8/1973 | |
| JP | 58-74721 | | 5/1983 | |
| JP | 60-62008 | | 4/1985 | |
| JP | 64-041110 A | * | 2/1989 | ............ H01B/7/08 |
| JP | 3-274610 | | 12/1991 | |
| JP | 4-82114 | | 3/1992 | |
| JP | 5-28853 | * | 2/1993 | ............ H01B/13/00 |
| JP | 05-062527 A | * | 3/1993 | ............ H01B/7/08 |

OTHER PUBLICATIONS

Patent Abstracts of Japan, vol. 018, No. 382 (E–1580), Jul. 19, 1994 & JP 06–111638 A, Apr. 22, 1994 *abstract*.

* cited by examiner

Primary Examiner—Dean A. Reichard
Assistant Examiner—William H. Mayo, III
(74) Attorney, Agent, or Firm—Armstrong, Westerman & Hattori, LLP (57) ABSTRACT

The cable of the present invention has a plurality of flat cables having a plurality of ribbon-shaped conductors and an insulating covering layer covering the ribbon-shaped conductors. The plurality of flat cables are arranged closely in parallel and have adjoining side edges continuously or intermittently connected over predetermined lengths. The process of producing the flat cables is to feed out a plurality of flat cables in one direction intermittently, transport them intermittently in the closely arranged state, take them up while continuously or intermittently heat bonding the adjoining side edges over predetermined lengths at the time of transport, and cut them at predetermined timings.

6 Claims, 11 Drawing Sheets

CABLE AND METHOD OF MANUFACTURING IT

TECHNICAL FIELD

The present invention relates to a bundle of wires, that is, a cable, used in a wiring system of a vehicle, electric and electronic apparatus, etc., more particularly relates to a cable formed by arranging a plurality of flat cables into a bundle and process of production of the same.

BACKGROUND OF THE INVENTION

Figure 1:
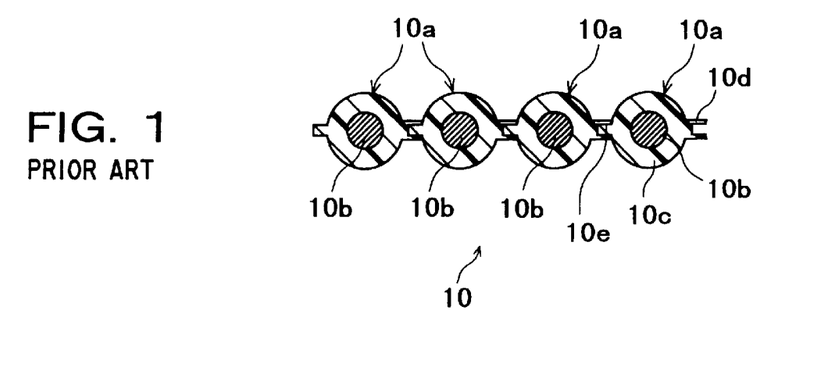
FIG. 1 is a partial sectional view of a wire harness disclosed in Japanese Unexamined Utility Model Publication (Kokai) No. 58-26114.

As the conventional cable, that is, wire harness, used as the electric wiring in an automobile or other vehicle, there is known for example the one disclosed in Japanese Unexamined Utility Model Publication (Kokai) No. 58-26114. The wire harness 10 disclosed in this publication is obtained, as shown in FIG. 1, by arranging in a flat plane a plurality of covered electric conductors 10a comprised of conductors 10b exhibiting a circular cross-section covered by an insulating material and connecting the adjoining covered electric conductors 10a to each other.

These plurality of covered electric conductors 10a have female engagement portions 10d exhibiting recessed cross-sections formed so as to extend along a longitudinal direction, and male engagement portions 10e. The male engagement portions exhibiting projecting cross-sections fitting with the female engagement portions 10d at symmetric positions 180 degrees apart on the insulating materials 10c of the covered electric conductors 10a. The electric conductors 10a are connected in a flat plane by fitting the female engagement portions 10d and male engagement portions 10e of adjoining covered electric conductors 10a with each other.

Japanese Unexamined Utility Model Publication (Kokai) No. 58-26114 also discloses a wire harness in which insulating materials 10c of adjoining covered electric conductors 10a are connected to each other by heat bonding without providing the female engagement portions 10d and male engagement portions 10e as described above on the insulating materials 10c of the covered electric conductors 10a.

Figure 2:
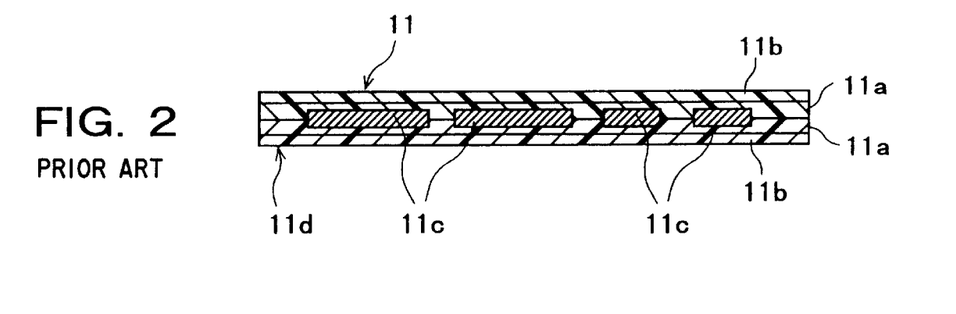
FIG. 2 is an enlarged sectional view of a conventional flat cable.

Further, as the conventional flat cable, the one shown in FIG. 2 has been known. This flat cable 11 is formed by sandwiching and heat bonding between a pair of insulating sheets 11b and 11b having resinous bonding layers 11a at opposing surfaces a plurality of ribbon-like conductors 11c exhibiting schematically rectangular cross-sections arranged in parallel at constant intervals.

Figure 3:
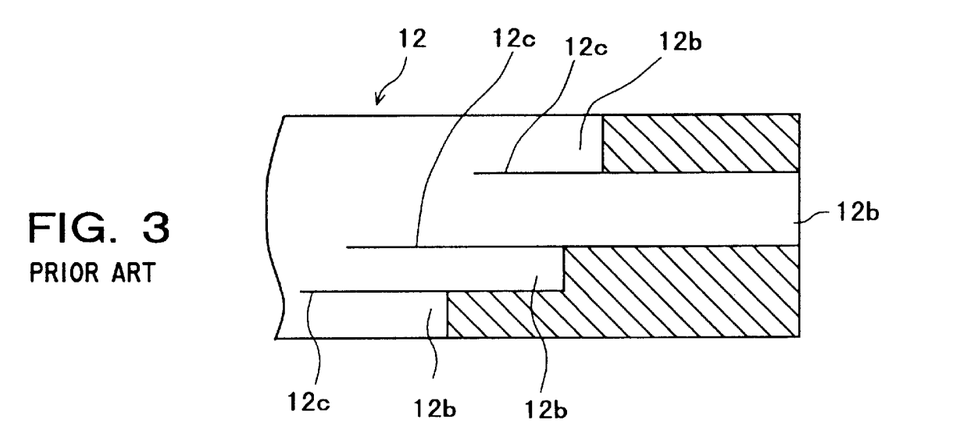
FIG. 3 is a partial plan view of a conventional cable using the flat cable shown in FIG. 2.

In the production of a wire harness 12 using the above flat cable 11, insulating sheets 11b and 11b having a broader width than those shown in FIG. 2 are used and a larger amount of ribbon-like conductors 11c are sandwiched and heat-fused between these insulating sheets 11b and 11b to produce the wire harness 12 as shown in FIG. 3.

This wire harness 12 is used, in accordance with the design of the wiring, by using a not illustrated cutter or the like to form a plurality of cuts 12c extending along the longitudinal direction over predetermined lengths so as to form a plurality of branch cables 12b each including one or more ribbon-like conductors 11c, attaching a not illustrated bundling connector to a front end having aligned end surfaces and connecting the same to a control portion or the like, and attaching not illustrated connectors to the other ends of the branch cables 12b and connecting them to different parts.

Further, as another wire harness using the flat cable 11, there exists one formed by superimposing a plurality of flat cables 11 as shown in FIG. 2 and partially bundling them by a bundling tape or the like.

In the wire harness 10 disclosed in Japanese Unexamined Utility Model Publication (Kokai) No. 58-26114, the cross-section of the conductor 10b is circular, therefore if conductors 10b having different cross-sections are used for the covered electric conductors 10a in accordance with the magnitude of the current used, the sectional shape of the entire wire harness 10 becomes unbalanced due to the difference of thicknesses of the covered electric conductors 10a and therefore the wiring becomes hard, so therefore usually conductors 10b having the same cross-sections must be used for the covered electric conductors 10a.

Accordingly, it is difficult to select the sectional areas of the conductors 10b in the covered electric conductors 10a in accordance with the used current, so the degree of freedom of the wiring is lowered.

On the other hand, in the wire harness 12 shown in FIG. 3, by making thicknesses of the ribbon-like conductors 11c constant and making the widths thereof appropriately different, ribbon-like conductors 11c having sectional areas in accordance with the magnitudes of the used electric currents can be assembled. However, in the design of the wiring, the lengths of the branch cables 12b are different in many cases, therefore the cutaway portions 12d which are to be cut away, indicated by hatching in FIG. 3, become large and the result is uneconomical—resulting in the cost rising by that amount. Further, at the time of wiring, the cuts 12c must be formed by a cutter or the like, so the wiring work is troublesome and the cost becomes higher.

Further, when a plurality of flat cables 11 cut into necessary lengths are partially bundled by a bundling tape or the like to form a wire harness, there are no longer any cutaway parts 12d as mentioned above, but the bundling is troublesome, so the cost becomes higher. Further, when passing the cable through a wiring protection tube or a wiring hole at the time of wiring, the bundling tape of each bundling portion sometimes become obstacles.

The problems described above can be solved by for example arranging a plurality of flat cables 11 as shown in FIG. 2 closely together in parallel and connecting adjoining flat cables 11 to each other by heat bonding them so as to produce a wire harness.

However, in such a flat cable 11, in order to prevent the connection portions from peeling, it is necessary to make the width of an ear portion 11d (refer to FIG. 2) of a side edge larger than the pitch of the plurality of ribbon-like conductors 10 arranged.

Accordingly, in the wire harness formed by connecting flat cables 11 with each other by the heat bonding, as described above, the interval between the ribbon-like conductors 11c located at the two sides of connection portions becomes considerably larger than the intervals between the ribbon-like conductors 11c at other positions, so the width of the wire harness becomes larger by that amount.

With such a wire harness having a large width, a larger wiring space becomes necessary when wiring in a limited space such as a vehicle or a housing of an electronic apparatus. Further, when inserting an end of a wire harness into a connector, an ordinary connector having a standard terminal pitch cannot be attached to the end, so it is necessary to provide a special connector.

On the other hand, if making the interval between the ribbon-like conductors 10c located at the two sides of the connection portion the same as the intervals of the ribbon-like conductors 11c at other positions by superposing the ear portions lid of the adjoining flat cables 11 on each other and then connecting them by heat bonding, a step difference is created at the connection portion and therefore it becomes hard to insert the result into the connector and the bending rigidity of this connection portion becomes high and therefore the wiring becomes difficult.

Further, a wire harness 12 formed by connecting flat cables 11 to each other by the heat bonding has a weak area at the connection portion, a susceptibility of the flat cables 11 to separation during handling, and faster melting of the bonding layer 11a than the insulating sheet 11b at the time of heat bonding and consequently protrusion of the bonded layer 11a from the connection portion. This protruded bonding layer 11a becomes soft under a relatively high temperature environment and is liable to mess up the wire harness 12 itself or peripheral members around it.

SUMMARY OF THE INVENTION

An object of the present invention is to provide a cable using a plurality of flat cables which can be produced at a lower cost without creating much of a discarded portion, which needs almost no cutting and other processing at the time of wiring, and by which the wiring can be carried out simply and at a lower cost.

Another object of the present invention is to provide a cable in which the connection portion of flat cables is higher in strength and has no step difference at the connection portion.

Still another object of the present invention is to provide a cable which is structured to enable the pitch of the ribbon-like conductors to be easily made constant and has a high degree of freedom in the wiring design.

Still another object of the present invention is to provide a process of production of a cable capable of achieving the objects mentioned above smoothly and efficiently.

The cable of the present invention is constituted as follows so as to achieve the above objects.

That is, the cable of the present invention is characterized by being provided with a plurality of flat cables comprising one or a plurality of parallel arranged ribbon-like conductors exhibiting substantially rectangular cross-sections and an insulating covering layer formed flat so as to integrally cover the ribbon-like conductors, the plurality of flat cables being arranged closely in parallel in a flat plane and the side edges of the adjoining flat cables being connected continuously or intermittently over predetermined lengths.

The cable of the above configuration can be configured so that each of the plurality of flat cables has a pair of step portions formed at the two side edges of the above insulating covering layer and so that the plurality of flat cables are connected continuously or intermittently over predetermined lengths in a state with the step portions of the adjoining flat cables complementarily joined.

The cable of the above configuration may be configured so that engagement projections are formed at the pair of step portions and the engagement projections mesh with each other in the state with the adjoining flat cables joined with each other.

The cable of the above configuration may be configured so that the pair of step portions have thicknesses t1 not more than the thickness t of the flat cables and so that both are formed on one surface of the flat cable or one is formed at one surface of the flat cable and the other is formed at the other surface of the flat cable.

The cable of the above configuration may be configured so that the lengths of the plurality of flat cables are set to at least two types of lengths.

The cable of the above configuration may be configured so that at least two of the plurality of flat cables have ends at one side arranged in the same plane.

The cable of the above configuration may be configured so that the insulating covering layer is comprised of a thermoplastic resin and so that the flat cables are connected to each other by heat bonding.

Further, the cable of the present invention is characterized by being provided with a plurality of flat cables comprising one or a plurality of parallel arranged ribbon-like conductors exhibiting substantially rectangular cross-sections and an insulating covering layer formed flat so as to integrally cover the ribbon-like conductors, the plurality of flat cables being alternately folded over each other in a state with edges of one sides of the adjoining flat cables aligned with each other and the edges of the one sides being connected continuously or intermittently over predetermined lengths.

The cable of the above configuration may be configured so that each of the plurality of flat cables has step portions formed at the superposed surfaces and so that the plurality of flat cables are connected by heat bonding continuously or intermittently over predetermined lengths in a state with the step portions back to back.

The cable of the above configuration may be configured so that the step portions have thicknesses t1 not more than the thickness t of the flat cables.

The cable of the above configuration may be configured so that the lengths of the plurality of flat cables are set to at least two types of lengths.

The cable of the above configuration may be configured so that at least two of the plurality of flat cables have ends at one side arranged in the same plane.

The cable of the above configuration may be configured so that the insulating covering layer is comprised of a thermoplastic resin and so that the flat cables are connected to each other by heat bonding.

The process of production of the cable of the present invention is characterized by comprising a feed out step of intermittently feeding out a plurality of flat cables in the same direction, a transport step of transporting the plurality of flat cables fed out by the feed out step in a state arranged closely to each other in parallel in synchronization with the feed in the above feed out step, a heat bonding step of continuously or intermittently heat bonding adjoining side edges of the plurality of flat cables transported by the transport step over predetermined lengths, a take up step of taking up the flat cables heat bonded by the above heat bonding step in synchronization with the transport in the above transport step, and a cutting step of cutting the plurality of flat cables at predetermined timings.

The process of production of the above configuration may be configured so that all of the flat cables other than one flat cable among the plurality of flat cables are fed out by predetermined lengths, then the other flat cables are cut by the above cutting step, the feed out of the cut flat cables is made to stop, the one flat cable is fed out by a predetermined length, then the other flat cables stopped being fed out are again fed out, the one flat cable is further fed out by a predetermined length, then the rear end of the one flat cable is cut at the same plane as the front end of the other flat cables.

The process of production of the above configuration may be configured so that first to fourth flat cables are used as the plurality of flat cables and, in the above feed out step, the first and second flat cables are simultaneously fed out, the third and fourth flat cables are fed out after the first and second flat cables are fed out to predetermined lengths, the second flat cable is cut by the above cutting step and the feed out of the second flat cable is made to stop after the third and fourth flat cables are fed out to predetermined lengths, the fourth flat cable is cut and the feed out of the fourth flat cable is made to stop after the second flat cable is cut, the first and third flat cables are fed out to predetermined lengths, then the first and third flat cables are cut with their rear ends in the same plane.

DETAILED DESCRIPTION OF THE INVENTION

Below, as the best mode of the cable of the present invention and the process of production of the same, a wire harness and a process of production of the same will be explained in detail based on FIG. 4 to FIG. 18.

Figure 4:
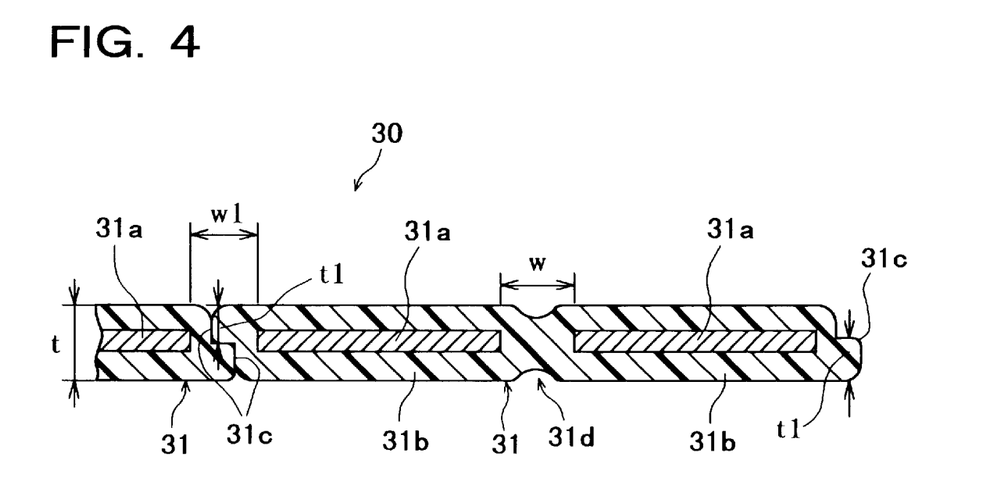
FIG. 4 is a partial sectional view of an unbonded state where flat cables constituting the cable according to a first embodiment of the present invention are made to abut against each other.
Figure 5:
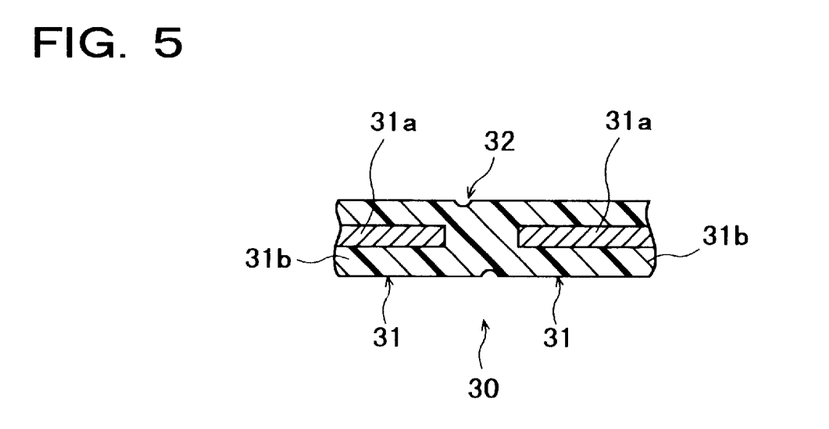
FIG. 5 is a partial sectional view of a state where flat cables are connected to each other by heat bonding from the state shown in FIG. 4.
Figure 6:
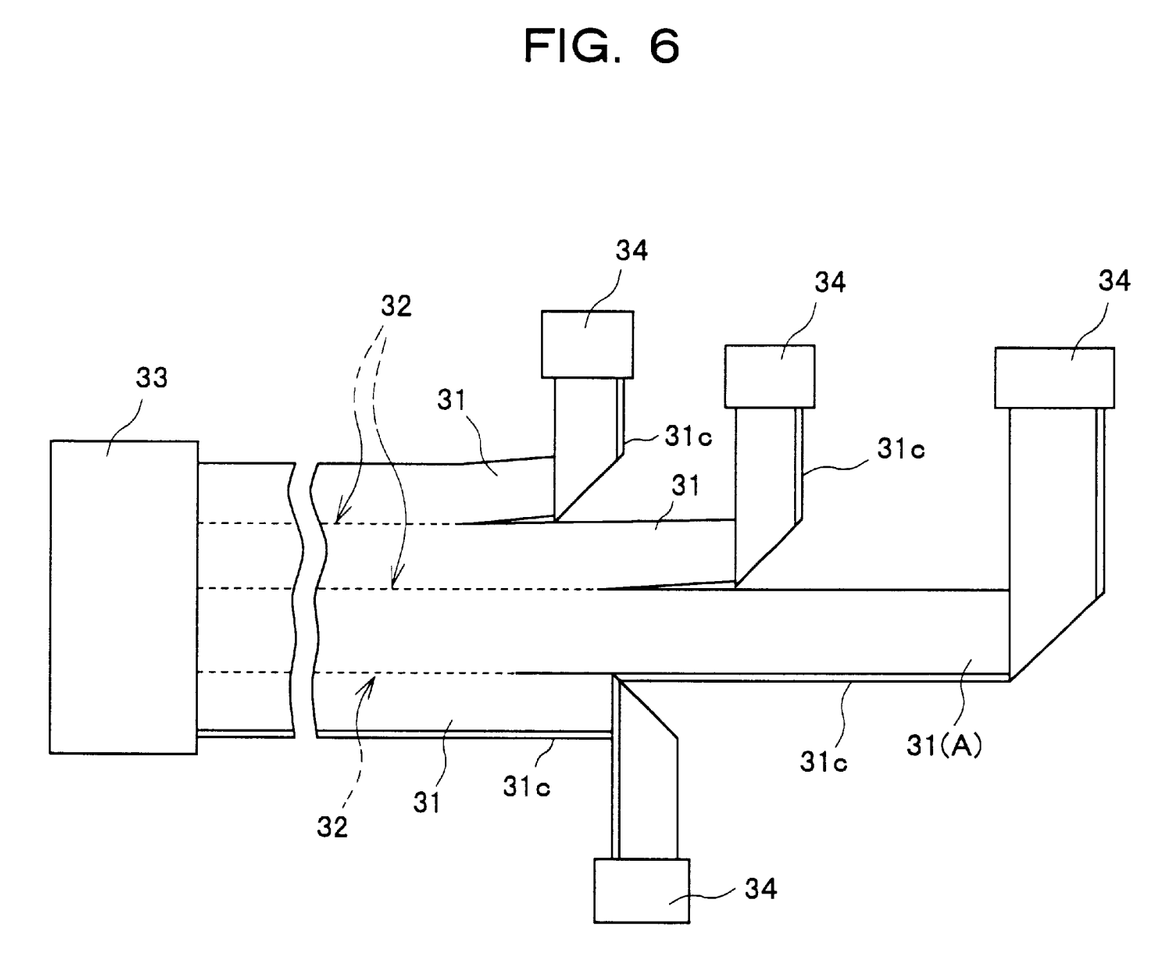
FIG. 6 is a plan view of a cable of the first embodiment.

FIG. 4 through FIG. 6 show a wire harness according to a first embodiment of the present invention. A wire harness 30 according to this embodiment is formed by arranging a plurality of long flat cables 31 in a flat plane and connecting adjoining flat cables 31 to each other.

Each of the flat cables 31 constituting this wire harness 30 is formed, as shown in FIG. 4, by a plurality of (here, two) ribbon-like conductor 31a formed by a copper or copper alloy with a cross-section forming a schematically rectangular shape and arranged in parallel at a predetermined intervals from each other and an insulating covering layer 31b formed so as to integrally cover these ribbon-like conductors 31a.

The insulating covering layer 31b is formed by directly extruding for example a polyamide-based resin, polyolefin-based resin, polyester-based resin, or other thermoplastic resin toward the ribbon-like conductors 31a.

In the flat cable 31, the portions of the insulating covering layer 31b located at the two side edges are integrally formed with step portions 31c having thicknesses t1 of about half of a thickness t of the flat cable 31. One step portion 12 is formed at an upper surface, while the other step portion 12 is formed at a lower surface. Further, the portions of the insulating covering layer 14 located between the adjoining ribbon-like conductors 31a and 31a are formed with groove-like recessed portions 31d at upper and lower surfaces thereof.

Each step portion 31c is constituted, as shown in FIG. 4, so that when flat cables 31 are arranged to abut against each other and the upper side step portion 31d of one flat cable 31 and the lower side step portion 31d of the other flat cable 31 are superimposed on each other, an interval w1 between the ribbon-like conductors 31a and 31a located at the two sides of this abutting portion becomes substantially equal to an interval w between the ribbon-like conductors 31a and 31a in the flat cables 31.

In this embodiment, one of the two step portions 31c was provided at the upper side, while the other was provided at the lower side, but it is also possible to provide the two step portions 31c on the upper side, that is, the same surface, or provide the two step portions 31c on the lower side.

The wire harness 30 shown in FIG. 6 is produced by making four flat cables 4 exhibiting the configuration mentioned above abut against each other in a state with the step portions 31c and 31c superimposed on each other as shown in FIG. 4 and heat bonding the step portions 31c and 31c at this abutting portion continuously or intermittently over predetermined lengths in the longitudinal direction to form bonded portions 32 as shown in FIG. 5.

This wire harness 30 is cut evenly that the front end (left end in FIG. 6) forms a single plane. A non-heat bonded portion is formed over a length required in wiring design at the rear end (right end in FIG. 6).

The front end of the wire harness 30 has attached to it a bundling connector 33 for connection to a control portion of the apparatus or the like, while the rear end of the wire harness 30 has attached to it a branch connection connector 34 for connection to the other parts.

In the present embodiment, two ribbon-like conductors 31 were arranged in one flat cable 31, but when taking the wiring design into account, preferably the number of ribbon-like conductors 31a is small, the widths (sectional areas) of the ribbon-like conductors 31a provided in the flat cables 31 are different, and the numbers of ribbon-like conductors 31a provided in the flat cables 31 are different.

In the wire harness 30 of this embodiment, the flat cables 31 were heat bonded to each other over exactly predetermined lengths, the front ends were formed with parts not heat bonded, and the flat cables 31 were formed to the desired lengths, therefore there are almost no discarded portions created at the time of wiring, so the wire harness can be produced at a lower cost, almost no cutting and other processing is required, and the wiring can be carried out easily at a lower cost. Further, even under a high temperature environment, the heat bonded portions do not become soft and stick to the peripheral members.

Further, each flat cable 31 is formed by extruding an insulating covering layer 31b made of a thermoplastic resin so as to cover the ribbon-like conductors 31a, therefore it is not necessary to make the width at the two side edges larger for giving strength. It is possible to easily make the intervals of ribbon-like conductors 31a in the wire harness formed by heat bonding the abutted side edges of flat cables 31 the same as the pitch of electrodes in the connectors 33 and 34. Accordingly, it becomes possible to smoothly attach a connector to the end of the wire harness.

Further, since the flat cables are made to abut against each other in the state with the step portions 31c formed on the flat cables 31 superimposed on each other and the abutting portion is continuously or intermittently heat bonded to connect them, the connection portion is strongly connected and no step difference is created in this connection portion.

Further, by decreasing the number of the ribbon-like conductors 31a and making the widths (sectional areas) and numbers of the ribbon-like conductors 31a of the flat cables 31 different, the degree of freedom in the wiring design is improved.

Furthermore, since each flat cable 31 is formed with groove-like recessed portions 31d, the flat cable 31 can be pulled apart and branched from the recessed portions 31d according to need.

Figure 7:
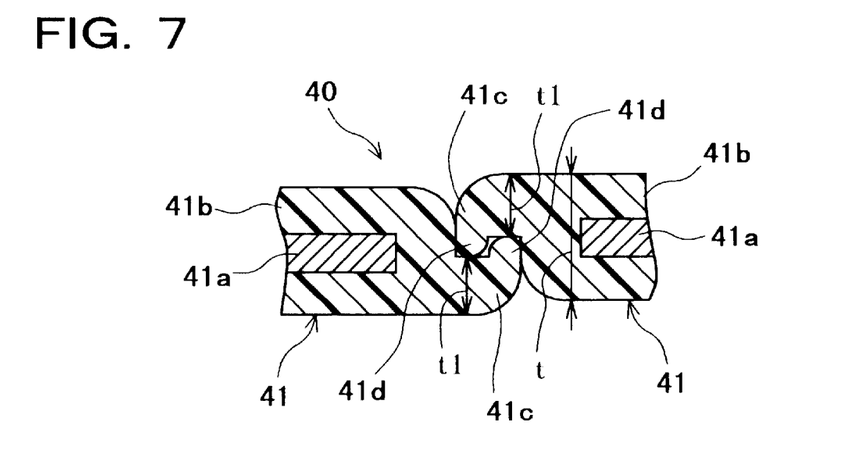
FIG. 7 is a partial sectional view of the unbonded state where flat cables constituting a cable according to a second embodiment of the present invention are made to abut against each other.
Figure 8:
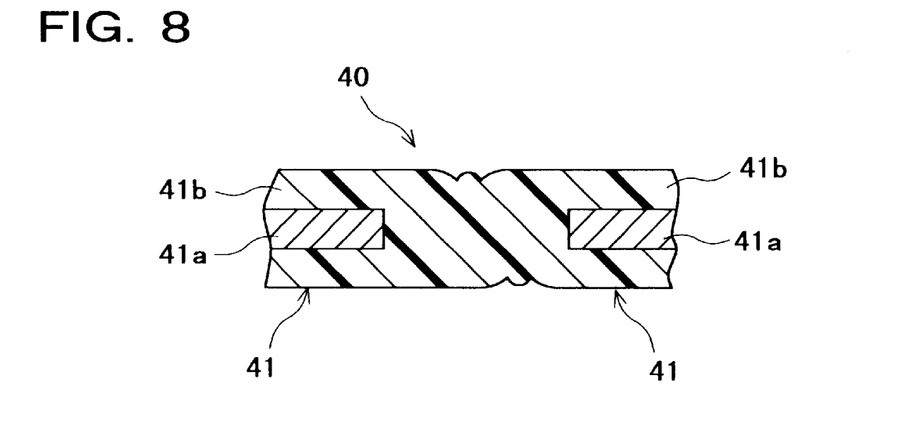
FIG. 8 is a partial sectional view of the state where flat cables are connected to each other by heat bonding from the state shown in FIG. 7.

FIG. 7 and FIG. 8 show a wire harness according to a second embodiment of the present invention. FIG. 7 is a partial sectional view of a state before flat cables 41 constituting a wire harness 40 are heat bonded to each other, while FIG. 8 is a partial sectional view of a state where the flat cables 41 are heat bonded to each other.

The wire harness 40 according to this embodiment is constituted, in the same way as the above embodiment, by arranging and connecting a plurality of flat cables 41 each comprising ribbon-like conductors 41a and an insulating covering layer 41b formed so as to integrally cover these ribbon-like conductors 41a. Further, step portions 41c are formed at the two side edges of each flat cable 41, while ends of these step portions 41c are formed with engagement projections 41d exhibiting projecting cross-sections projecting in a vertical direction to a uniform height.

The step portions 41c of the adjoining flat cables 41 are superimposed and made to abut against each other so that the engagement projections 41d mesh with each other. Each abutting portion is continuously heat bonded over the required length. Due to this heat bonding, the engagement projections 41d are crushed together and integrally connected as shown in FIG. 8.

In this way, by providing the engagement projection 41d at the end of each step portion 41c, when connecting together the flat cables 41, the work for superimposing the step portions 41c in the meshed state becomes very easy.

The rest of the configuration, mode of operation, and advantageous effects of the wire harness 40 according to the second embodiment are similar to those of the wire harness 30 according to the first embodiment, so explanations of them will be omitted.

Figure 9:
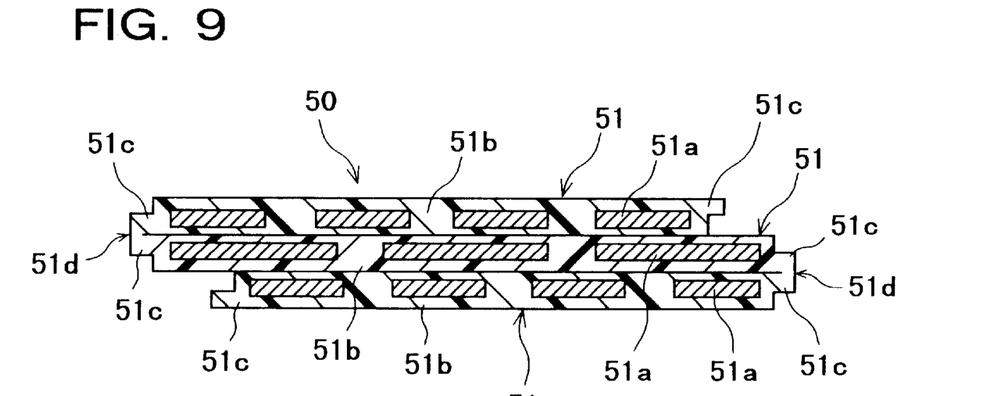
FIG. 9 is a sectional view of a cable according to a third embodiment of the present invention.
Figure 10:
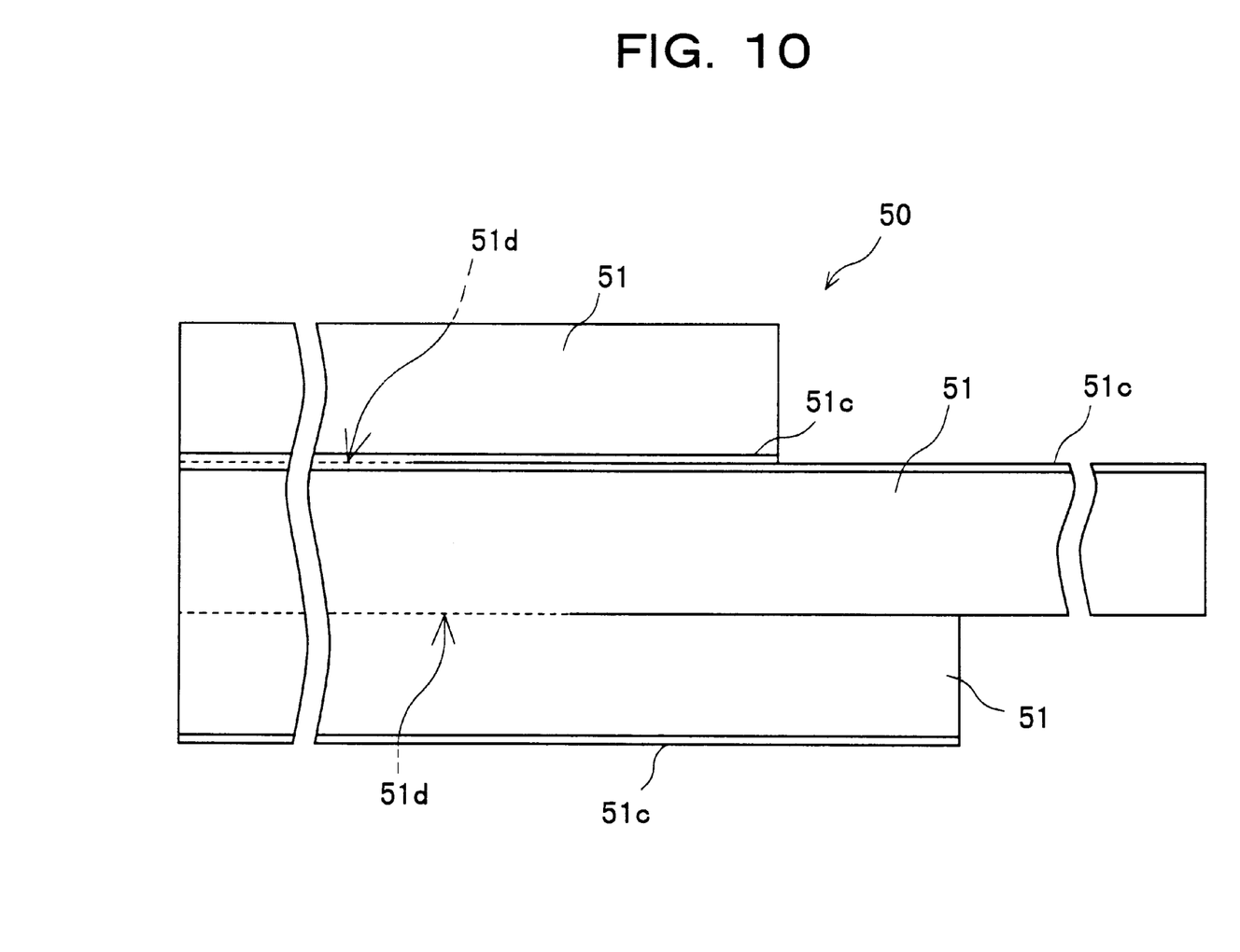
FIG. 10 is a partial plan view of a state where the cable shown in FIG. 9 is opened up.

FIG. 9 and FIG. 10 show a wire harness according to a third embodiment of the present invention. FIG. 9 is a sectional view of same, while FIG. 10 is a partial plan view of a state where a flat cable 51 constituting a wire harness 50 is opened up.

The wire harness 50 according to this embodiment is comprised, in the same way as the above embodiment, by arranging and connecting three flat cables 51 each comprising ribbon-like conductors 51a and an insulating covering layer 51b shaped so as to integrally cover these ribbon-like conductors 51a and folding them from the connection portions to superimpose them.

Namely, it is produced by arranging flat cables so as to make end surfaces of step portions 51c and 51c formed at side edges of adjoining flat cables 51 abut against each other and continuously or intermittently heat bond the abutting portions over the required lengths to form flexible heat bonded portions 51d (connection portions).

In this wire harness 50, as shown in FIG. 10, in the same way as the first embodiment, the front end thereof (left side in FIG. 10) is cut evenly to a single plane. The rear end (right side in FIG. 10) is formed with a part where the flat cables 51 are not heat bonded to each other over the required length. Further, a not illustrated bundling connector is attached to the front end of the wire harness 50, while a not illustrated branch connection connector is attached to the rear end.

This wire harness 50 according to the third embodiment is suited for use in the state where the flat cables 51 are folded back. The rest of the configuration, mode of operation, and advantageous effects are similar to those of the wire harness 30 according to the first embodiment, so explanations thereof will be omitted.

Note that, it is also possible to produce a wire harness as in the third embodiment by alternately folding back flat cables of the wire harnesses according to the first and second embodiments and further a fourth embodiment mentioned later along the connection portions thereof.

Figure 11:
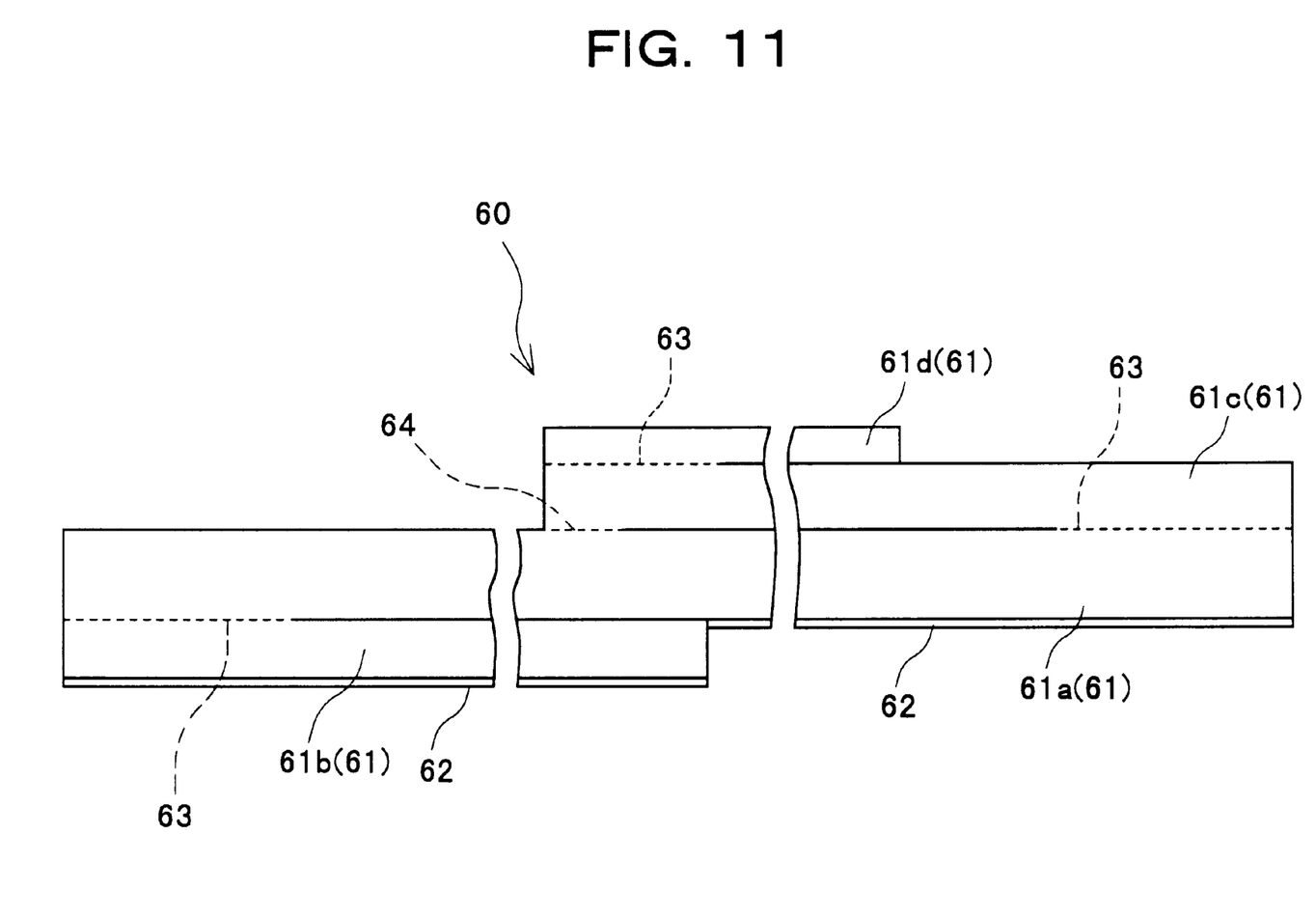
FIG. 11 is a plan view of a cable according to a fourth embodiment of the present invention.
Figure 12:
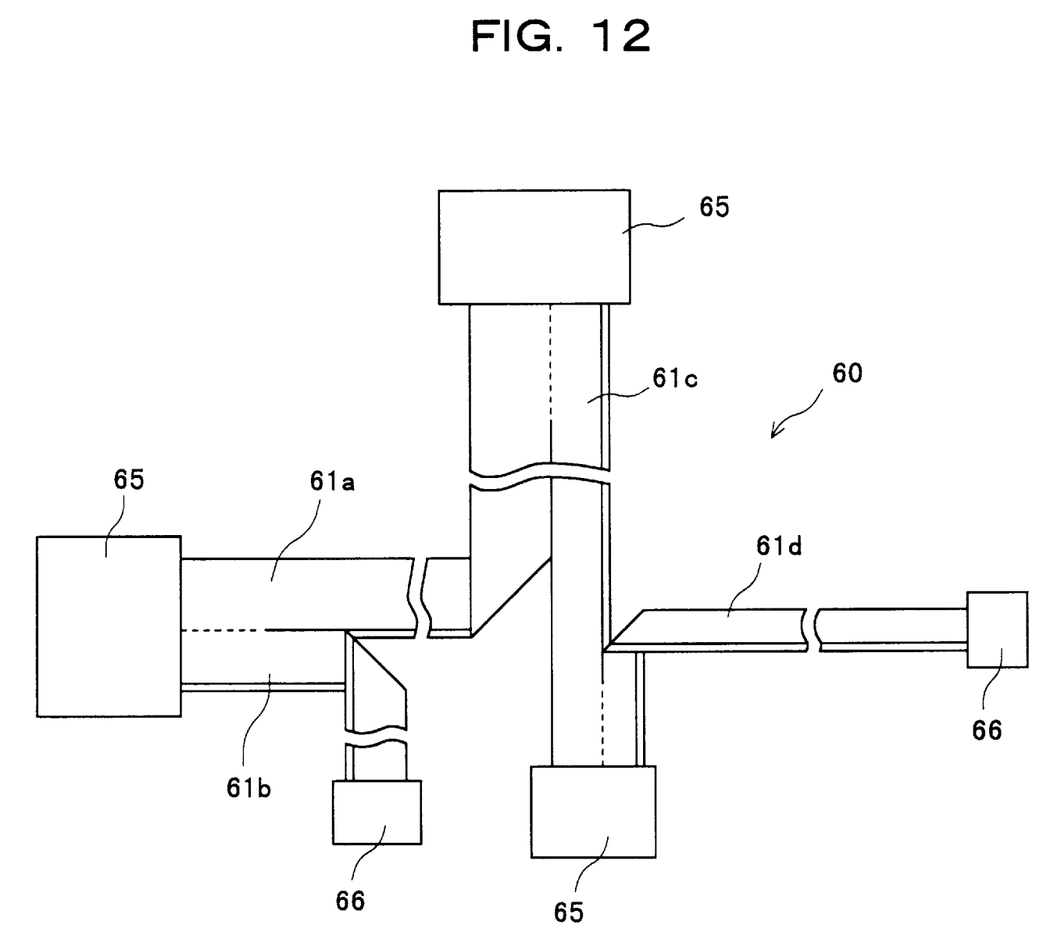
FIG. 12 is a plan view of a state where a connector is attached to the cable shown in FIG. 11.

FIG. 11 and FIG. 12 show a wire harness according to a fourth embodiment of the present invention. FIG. 11 is a plan view, while FIG. 12 is a plan view of the state where a connector is attached to the end of a wire harness 60.

The wire harness 60 according to this embodiment is constituted by connecting four flat cables 61a, 61b, 61c, and 61d. As shown in FIG. 11, the front end (left end in FIG. 11) of the longest first flat cable 61a is aligned so as to be in the same plane as the front end of a second flat cable 61b, while the rear end thereof (right end in FIG. 11) is aligned so as to be in the same plane as the rear end of a third flat cable 61c. The front end of the third flat cable 61c is aligned so as to be in the same plane as the front end of a fourth flat cable 61d.

The first flat cable 61a and the second flat cable 61b are connected to each other by heat bonded portions 63 where the step portions 62 formed at the two side edges are heat bonded over a predetermined length at the front end side. The first flat cable 61a and the third flat cable 61c are connected to each other by heat bonded portions 63 where the step portions 62 formed at the two side edges are heat bonded over a predetermined length at the rear end side and by temporary fastening portions 64 heat bonded over short lengths of the front end of the third flat cable 61c and the middle part of the first flat cable 61a. Further, the third flat cable 61c and the fourth flat cable 61d are connected to each other by heat bonded portions 63 where the step portions 62 formed at the two side edges are heat bonded over predetermined lengths at the front end.

In this wire harness 60, as shown in FIG. 12, the temporary fastening portions 64 are pulled apart, bundling connectors 65 are attached to front ends of the first flat cable 61a and the second flat cable 61b, rear ends of the first flat cable 61a and the third flat cable 61c, and front ends of the third flat cable 61c and fourth flat cable 61d, and branch connectors 66 are attached to the rear end of the second flat cable 61b and the rear end of the fourth flat cable 61d.

This wire harness 60 according to the fourth embodiment is suited for a not illustrated apparatus or piece of equipment in which there are a central control system and a plurality of peripheral control systems controlled by this central control system so as to connect the central control system and terminal parts of the peripheral control systems via the peripheral control systems.

Accordingly, it is also possible that the number of flat cables 61 with aligned ends is not two as illustrated, but three or more.

The rest of the configuration, mode of operation, and advantageous effects of the wire harness 60 according to the fourth embodiment are substantially the same as those of the wire harness 30 according to the first embodiment, so explanations thereof will be omitted.

Note that, even in an embodiment wherein the flat cables 51 are superimposed as in the third embodiment, in the state where ends of at least one side of two or more adjoining flat cables 51 are aligned like the wire harness 60 of the fourth embodiment, side edges of these aligned ends can be connected to each other by continuous or intermittent heat bonding over the required length.

In the second to fourth embodiments mentioned above, the thickness of the step portions 41c, 51c, and 62 was made about a half of the thickness t of the flat cables 41, 51, and 61, but they can be formed to less than half if there is no problem in strength and can be formed within a range from half to an equivalent thickness t if there is no problem in wiring.

Next, an explanation will be made of the process of production of wire harnesses according to the first embodiment and second embodiment.

Figure 13:
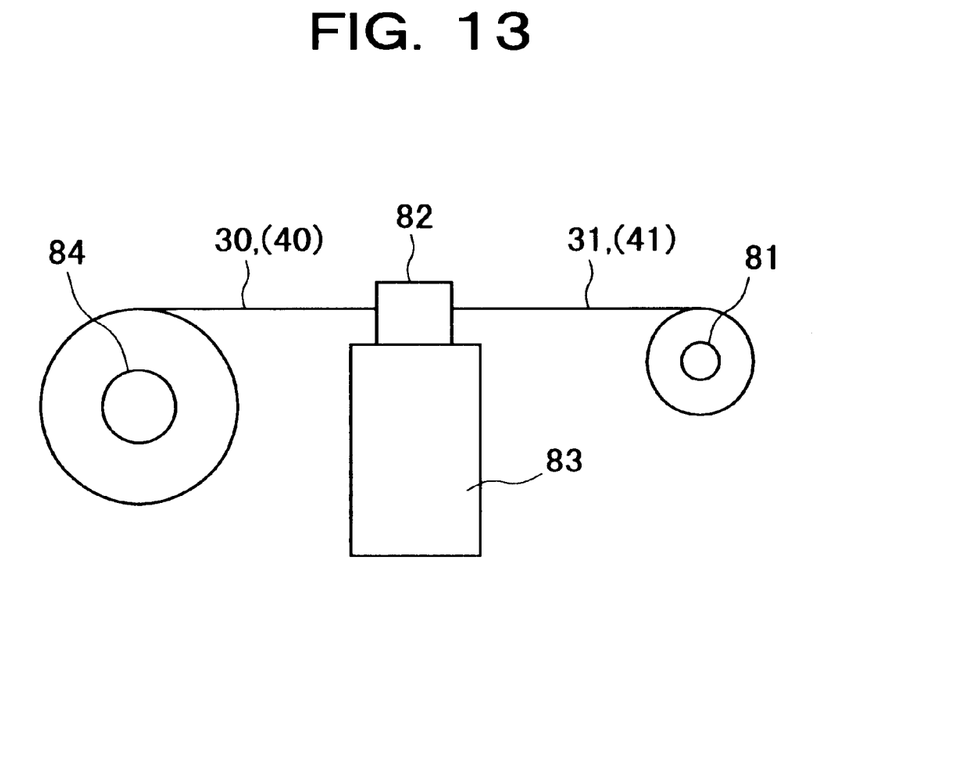
FIG. 13 is a schematic front view of a production apparatus of the flat cables constituting the cable of the present invention.
Figure 14:
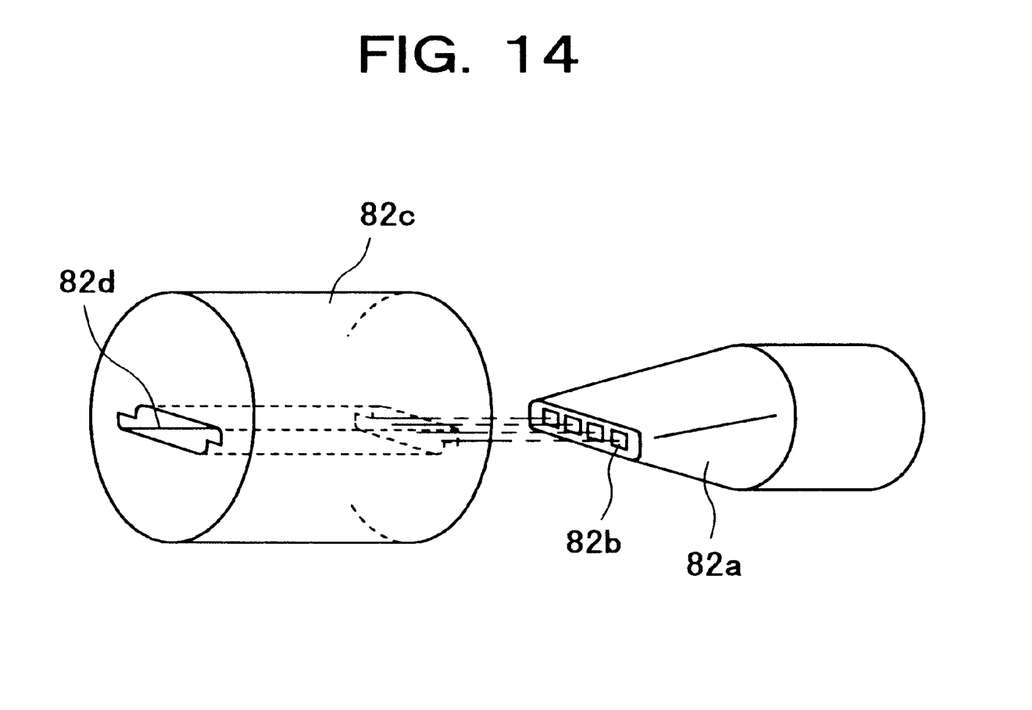
FIG. 14 is a partially enlarged perspective view of the internal structure of the production apparatus shown in FIG. 13.
Figure 15:
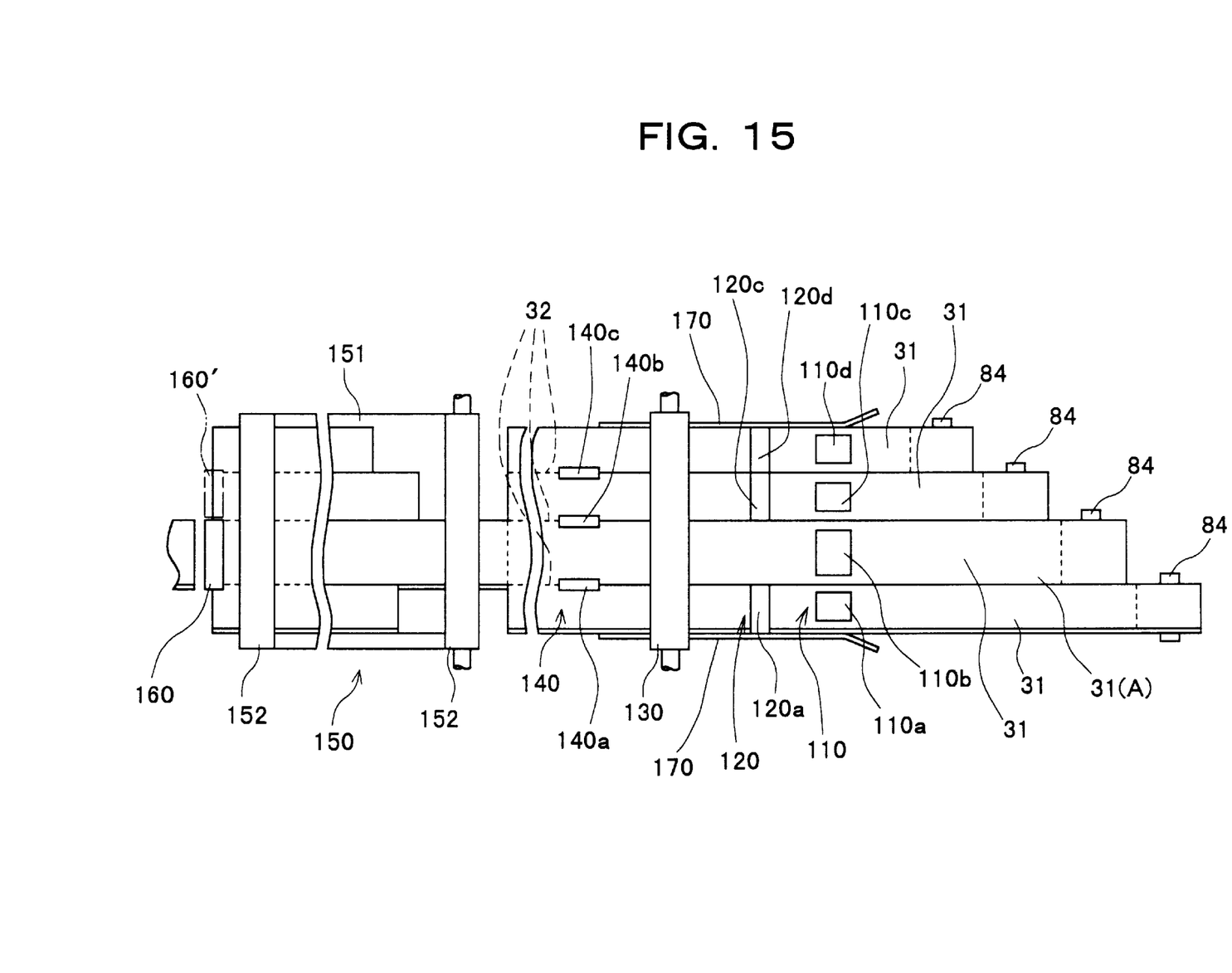
FIG. 15 is a plan view of a production apparatus for producing the cable of the present invention.
Figure 16:
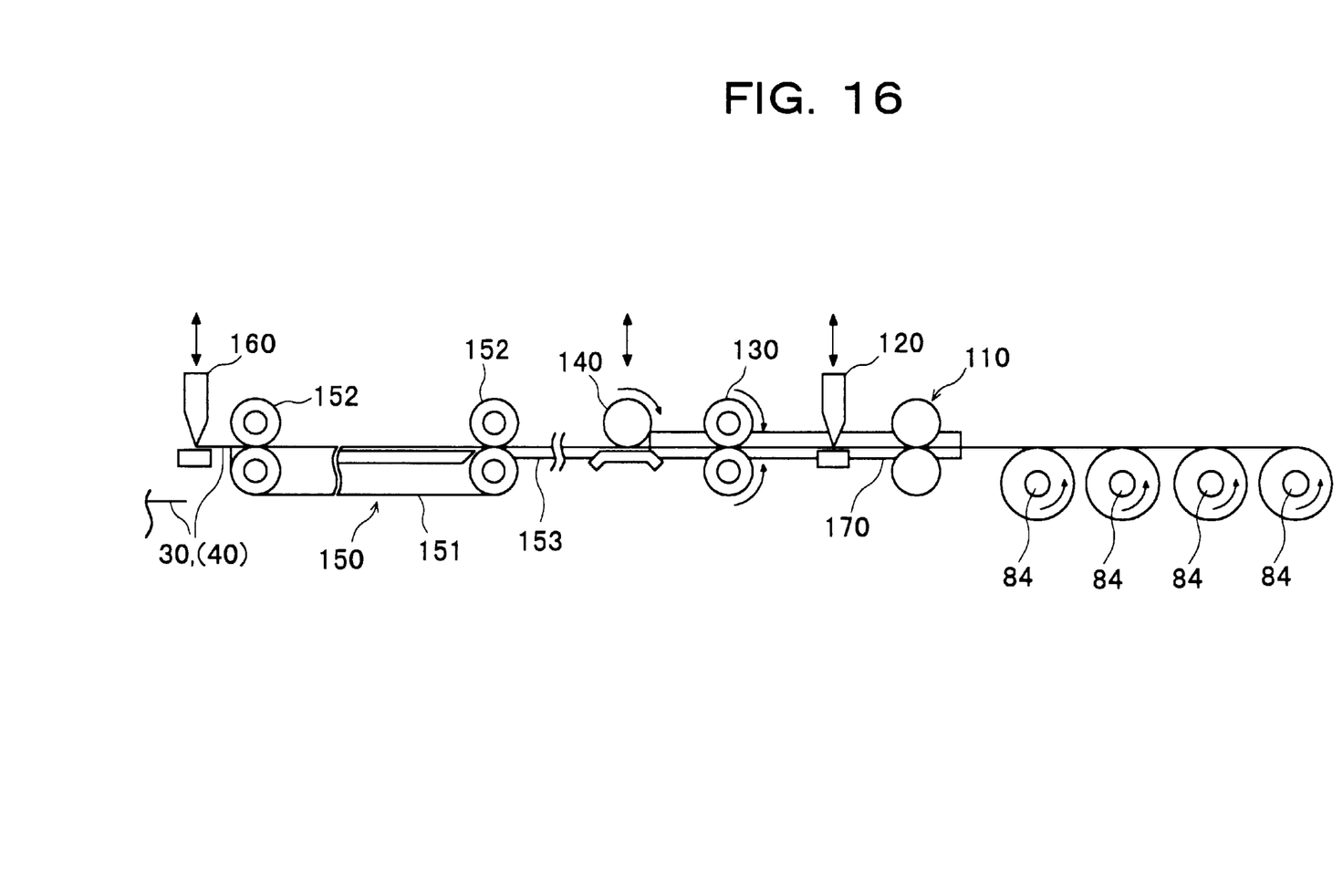
FIG. 16 is a front view of the production apparatus shown in FIG. 15.

FIG. 13 is a front view of a production apparatus 80 used when producing the flat cable 31 (41); FIG. 14 is a partially enlarged perspective view of the production apparatus 80 shown in FIG. 13; FIG. 15 is a plan view of a production apparatus 100 used when producing the wire harness 30 (40) of the present invention; and FIG. 16 is a front view of the production apparatus 100 shown in FIG. 15.

As shown in FIG. 13, this production apparatus 80 is provided with a draw out bobbin for drawing out the ribbon-like conductors 31a (41a) in a state where they are arranged in parallel at a predetermined pitch, an extruder 83 having a crosshead 82 at an upper portion, a take up bobbin 84 for taking up the produced flat cable 31 (41), and so on as its fundamental configuration.

The plurality of ribbon-like conductors 31a (41a) drawn out in a state of parallel arrangement from the draw out bobbin 81, as shown in FIG. 14, are guided by a plurality of nipple holes 82b formed so as to extend in parallel to each other when passing through an extrusion nipple 82a disposed in the crosshead 82.

Then, each ribbon-like conductor 31a (41a) is extruded through a die hole 82d of an extrusion die 82c together with the thermoplastic resin in the hot melt state filled under pressure in the crosshead 82. As shown in FIG. 4 and FIG. 7, the insulating covering layer 31b (41b) accordingly integrally covers the ribbon-like conductors 31a (41a) arranged in parallel, whereby the flat cable 31 (41) is produced. The produced flat cable 31 (41) is successively taken up by the take up bobbin 84 after air-cooling.

The take up bobbin 84 having taken up the flat cable 31 (41) is then disposed on a starting end of the production apparatus 100 shown in FIG. 15 and FIG. 16, that is, a wire harness production line.

This production apparatus 100 is provided with a first feed device 110 for intermittently feeding out the flat cables 31 and 41 taken up around the take up bobbins 84, a first cutter 120 which is arranged downstream of the first feed device 110 and cut the flat cables, a second feed device 130 which is arranged downstream of this first cutter 120 and intermittently transfers the flat cables, a heat bonding device 140 which is arranged downstream of the second feed device 130 and heat bonds the flat cables to each other, a take up device 150 for taking up the flat cables connected by the heat bonding, a second cutter 160 which is arranged downstream of this take up device 150 and cuts the flat cables, and so on as its fundamental configuration.

The flat cables 31 (41) of the take up bobbins 84 are straightened by pairs of pinch rollers 110a, 110b, 110c, and 110d provided corresponding to the flat cables. The flat cables are intermittently fed out in a single direction (from right to left direction in FIG. 15 and FIG. 16).

When producing the wire harness 30 of the first embodiment, at the start of the production line, flat cables 31 are fed out together in the state with the front ends aligned.

Next, the flat cables 31 (41) are intermittently transferred in the left direction in synchronization with the first feed device 110 by the second feed device 130 in the state where they are arranged close together in parallel. In this transfer step, side edges of the adjoining flat cables 31 (41) are continuously or intermittently heat bonded over predetermined lengths by the heat bonding devices 140a, 140b, and 140c.

Here, it is also possible for the second feed device to be constituted by pinch rollers arranged corresponding to the flat cables, but it may also be constituted by a pair of long pinch rollers vertically arranged so as to uniformly grip the flat cable 31 (41) in this embodiment.

As described above, when heat bonding side edges of the adjoining flat cables 31(41), they are heat bonded superimposed so that the step portion 31c (41c) formed at the side edges mesh with each other. Therefore, in this embodiment, between adjoining flat cables 31 (41), the take up bobbin 84 upon which one flat cable 31 (41) having the step portion 31c (41c) to be superimposed on the top is wound, is arranged at the rear (upstream) of the production line from the take u bobbin 84 u on which the other flat cable 31(41) is wound.

Further, at the position of the second feed device 130, in order to restrict the movement of each flat cable 31 (41) in the width direction so that the flat cables 31(41) are reliably superimposed in a state with the step portions 31c (41c) of side edges of the flat cables 31(41) meshed with each other, guide rails 170 are disposed at sides of the transfer line of the flat cables 31 (41) in this embodiment.

After the heat bonding, in the process of the flat cables 31 (41) being intermittently transferred along the tops of the guide rails 153 (refer to FIG. 16), the heat bonding portions 32 are air-cooled and the cable is taken up by a take up device 150 operating in synchronization with the intermittent transfer of the second feed device 130.

In this embodiment, the take up device 150 is constituted by a belt conveyor 151 arranged at the bottom of the transfer line and pinch rollers 151 arranged above the front and rear ends of the belt conveyor 151, but can be constituted by a take up drum or the like too.

In the above series of steps, the flat cables 31 other than the single longest flat cable 31(A) among the flat cables 31 constituting the wire harness 30 produced are cut by the first cutter 120 (120a, 120b, and 120c) between the first feed device 110 and the second feed device 130 whenever they are fed out by predetermined lengths by the first feed device 110. The operation of the first feed device units 110a, 110c, and 110d feeding out the cut flat cables 31 is stopped simultaneously with this cutting.

The longest flat cable 31(A) functions as a guide at the transfer or take up of the other flat cables 31. When this flat cable 31(A) is fed out by a predetermined length, the stopped first feed device units 110a, 101c, and 110d are driven again, and the other flat cables 31 are fed out together again in the state in the same plane as the front end of the longest flat cable 31(A).

Then, the longest flat cable 31(A) among the flat cables 31 fed out by exactly the predetermined lengths and taken up by the take up device 150 is cut by the second cutter 160 at the position where it is in the same plane as the front end of the other flat cables 31 in the following wire harness 30.

By the above steps, the wire harness 30 (40) according to the first embodiment is efficiently and continuously produced.

Note that when the take up device 150 is constituted by a take up drum or the like, the longest flat cable 31(A) is not cut as mentioned above, but is cut so as to match with the front ends of the other flat cables 31 of the following other wire harness in the wiring work.

Next, an explanation will be made of the process of production of a wire harness 60 according to the fourth embodiment. The process of production of this wire harness 60 is basically the same as the process of production mentioned above, but the timing of operation of the first feed device 110, first cutter 120, and heat bonding device 140 differ, so the explanation will be made mainly of different points.

First, the first flat cable 61a and second flat cable 61b set to the longest length are synchronously intermittently fed out by the corresponding first feed device units 110b and 110a in the state where the front ends are aligned in the same plane, then are intermittently transferred in the state with the step portions 62 superimposed on each other by the second feed device 130. In this transfer step, side edges of front areas of the first flat cable 61a and second flat cable 61b are continuously or intermittently heat bonded over predetermined lengths by the heat bonding device unit 140a.

Then, the third flat cable 61c and fourth flat cable 61d are synchronously intermittently fed out by the corresponding first feed device units 110c and 110d in the state with the front ends aligned in the same plane, then intermittently transferred by the second feed device 130 in the state with the step portions 62 superimposed on each other. At this time, the step portion 62 of the other side edge of the third flat cable 61c is superimposed on the corresponding step portion 62 of the first flat cable 61a.

In the transfer step, the side edges of the front end areas of the third flat cable 61c and fourth flat cable 61d are continuously or intermittently heat bonded over the predetermined length by the heat bonding device unit 140c. Simultaneously, side edges of the front end areas of the third flat cable 61c and the first flat cable 61a are heat bonded over a short length to form a temporary fastening portion 64 between them.

Then, the flat cables 61 are successively taken up by the take up device 150. When a predetermined position is reached, the second and fourth flat cables 61b and 61d are cut by the corresponding first cutter units 120a and 120d. Simultaneously with the cutting, the corresponding first feed device units 110a and 110d stop their operations.

Thereafter, when the first flat cable 61a and the third flat cable 61c are fed out by predetermined lengths, the first feed device unit 110a is driven again, the second flat cable 61b is fed out, and the side edges of the first and third flat cables 61a and 61c are heat bonded over a predetermined length by the heat bonding device unit 140b. Then, when matching with the front end of the second flat cable 61b of the following wire harness 60, the rear ends of the first and third flat cables 61a and 61c are cut by the second cutters 160 and 160'.

By the repetition of the above steps below, wire harnesses 60 are continuously produced.

In the process of production mentioned above, when heat bonding flat cables by superimposing them in the vertical direction so that step portions 31c, 41c, and 62 formed at side edges of the adjoining flat cables 31, 41, and 61 mesh with each other, the take up bobbins 84 upon which the flat cables 31, 41, and 61 having the step portions 31c, 41c, and 62 to be superimposed from above are wound are arranged at the rear of the production line from the take up bobbins 84 upon which the other flat cables 31, 41, and 61 having the step portions 31c, 41c, and 62 to be superimposed from below are wound.

Figure 17:
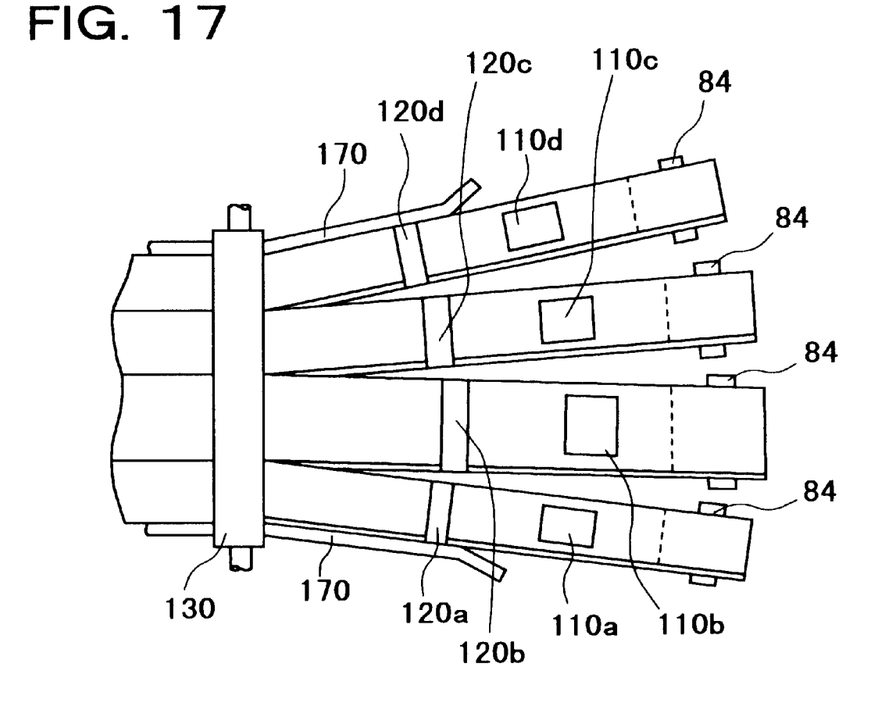
FIG. 17 is a partial plan view of a modification of the production apparatus for producing the cable of the present invention.

However, the arrangement of the take up bobbins 84 is not limited to the above. For example, as shown in FIG. 17, the take up bobbins 84 may be arranged in a fan shape so as to fan out in a horizontal plane starting from the second feed device 130. Step portions formed on the side edges of the adjoining flat cables 31, 41, and 61 are superimposed in the vertical direction by the second feed device 130.

Figure 18:
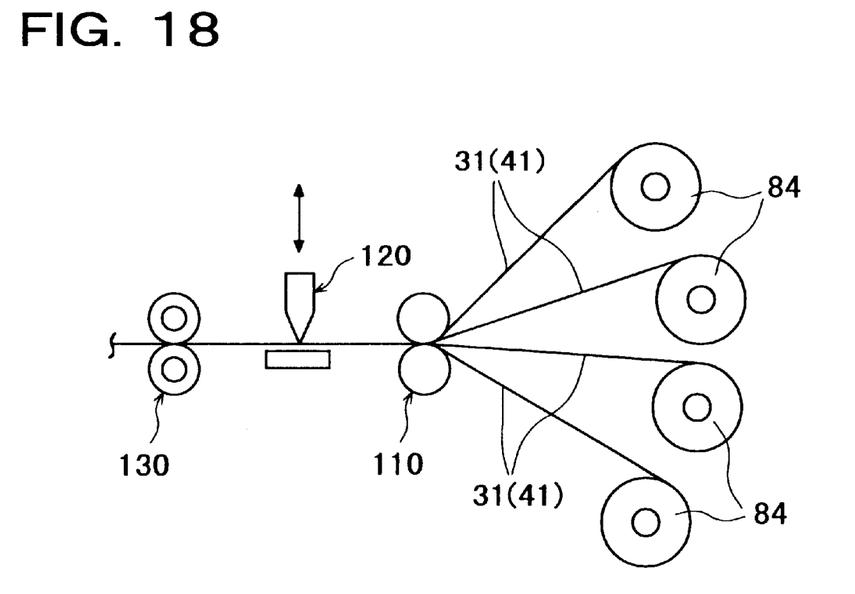
FIG. 18 is a partial front view of another modification of the production apparatus for producing the cable of the present invention.

Further, as shown in FIG. 18, the take up bobbins 84 may be arranged to be in close proximity when seen from a plan view, the take up bobbins 84 holding the flat cables 31, 41, and 61 having the step portions 31c, 41c, and 62 to be superimposed from above may be arranged further above, and the step portions formed on the side edges of the adjoining flat cables 31, 41, and 61 may be superimposed from the vertical direction by the second feed device 130.

As explained above, according to the wire harness of the present invention, at the time of wiring, almost no part to be discarded is created, therefore a wire harness can be provided at lower costs without waste.

Further, at the time of wiring, almost no cutting or other processing is required, therefore the wiring can be carried out more easily at a lower cost.

Further, in each flat cable, the insulating covering layer is formed by extruding a thermoplastic resin so as to cover the ribbon-like conductors, therefore the mechanical strength is enhanced. Accordingly, it is not necessary to make the width of the two side ear portions large as in the related art and a connector of a predetermined standard can be easily attached to the end of the obtained wire harness in the normal state.

Further, even under a high temperature environment, the heat bonding portions can be prevented from becoming soft and sticking to peripheral members around the wiring.

Further, by decreasing the number of the ribbon-like conductors to be assembled in the flat cable and making the width (sectional area) or number of the ribbon-like conductors for every flat cable different, the degree of freedom of the wiring design is improved.

Further, by making the flat cables abut against each other in the superimposed state so that the step portions formed on the flat cables mesh with each other and continuously or intermittently heat bonding these abutting portions to connect them, the flat cables can be easily connected.

Further, by stacking flat cables on each other and heat bonding step portions provided at their side edges, the flat cables can be easily connected.

According to the process of production of the cable of the present invention, that is, the wire harness, the wire harness can be produced smoothly and efficiently.

Further, by cutting the longest flat cable so as to match with the front end of the following wire harness, at the time of wiring, the trouble of cutting the wire harnesses from each other as in the related art can be eliminated so the work efficiency is improved.

INDUSTRIAL APPLICABILITY

As described above, according to the cable of the present invention and the process of production of the same, cables having a high degree of freedom of wiring are provided at low cost and without waste, therefore the invention is useful for use or wire harnesses for electric wiring in automobiles and other vehicles or cables for electric wiring in electronic apparatuses etc.

What is claimed is:

1. A cable comprising at least two flat cable units (31), each flat cable unit consisting of:

a plurality of ribbon-like conductors (31a) extending in a longitudinal direction of the at least two flat cable units(31) in parallel relationship to each other and spaced at an interval (w), an insulating covering layer (31b) covering the ribbon-like conductors (31a) and made of thermoplastic resin, the plurality of ribbon-like conductors (31a) and the insulating covering layer (31b) being integrally formed by extruding, each insulating covering layer (31b) having a step portion (31c) provided at an edge and extending in a longitudinal direction of the insulating covering layer, the step portion (31c) having a thickness of about half of a thickness at a spaced portion in the insulating covering layer (31b) where is no ribbon-like conductor and having a width of about half of the interval (w), and a first step portion (31c) of a first insulating covering layer in a first cable unit and a second step portion (31c) of a second insulating covering layer in a second flat cable unit being superimposed and heat bonded to integrate the first and second flat cable units.

2. A cable according to claim 1, wherein each of at least two flat cable units has a pair of step portions formed at the two side edges of the insulating covering layer; and the plurality of flat cable units are connected continuously over predetermined lengths with the step portions of adjoining flat cable units complementarily bonded.

3. A cable according to claim 2, wherein the pair of step portions have thicknesses (t1) not more than the thickness (t) of the at least two flat cable units and both are formed on one surface of the at least two flat cable units or one is formed at one surface of the at least two flat cable units and the other is formed at an other surface of the at least two cable units.

4. A cable according to claim 2, wherein lengths of the at least two flat cable units are set to at least two different lengths.

5. A cable according to claim 1, wherein at least two of the at least two flat cable units have ends at one side arranged in the plane.

6. A cable according to claim 1, wherein each step portion (31c) of the insulating covering layer (31b) has a shape of an engagement projection; and wherein the first and second step portions are engaged to each other.

* * * * *

UNITED STATES PATENT AND TRADEMARK OFFICE
CERTIFICATE OF CORRECTION

PATENT NO. : 6,538,205 B2  
DATED : March 25, 2003  
INVENTOR(S) : Ueno, Seiichi It is certified that error appears in the above-identified patent and that said Letters Patent is hereby corrected as shown below:

<u>Title page,</u>
Item [54], Title, please change "CABLE AND METHOD OF MANUFACTURING IT" to be -- CABLE AND PROCESS OF PRODUCTION THEREOF --.

Signed and Sealed this

Seventh Day of October, 2003

JAMES E. ROGAN
*Director of the United States Patent and Trademark Office*